United States Patent
de Buda

(10) Patent No.: US 6,876,245 B2
(45) Date of Patent: Apr. 5, 2005

(54) HIGH SPEED BI-DIRECTIONAL SOLID STATE SWITCH

(75) Inventor: Eric George de Buda, Toronto (CA)

(73) Assignee: Kinectrics Inc., Toronto (CA)

( * ) Notice: Subject to any disclaimer, the term of this patent is extended or adjusted under 35 U.S.C. 154(b) by 0 days.

(21) Appl. No.: 10/438,123

(22) Filed: May 15, 2003

(65) Prior Publication Data

US 2004/0227560 A1 Nov. 18, 2004

(30) Foreign Application Priority Data

Apr. 29, 2003 (CA) .............................................. 2427039

(51) Int. Cl.$^7$ .......................................... H03K 17/687
(52) U.S. Cl. ...................................... 327/427; 327/436
(58) Field of Search ................................ 327/365, 425, 327/426, 427, 436

(56) References Cited

U.S. PATENT DOCUMENTS

| | | | |
|---|---|---|---|
| 3,215,859 A | 11/1965 | Sorchych | 307/88.5 |
| 3,532,899 A | 10/1970 | Huth et al. | 307/251 |
| 4,477,742 A | 10/1984 | Janutka | 307/571 |
| 4,480,201 A | 10/1984 | Jaeschke | 307/570 |
| 4,491,750 A * | 1/1985 | Janutka | 327/436 |
| 4,500,802 A * | 2/1985 | Janutka | 327/432 |
| 4,591,734 A | 5/1986 | Laughton | 307/248 |
| 4,611,123 A | 9/1986 | McDonald | 250/551 |
| 4,742,380 A | 5/1988 | Chang et al. | 357/23.4 |
| 4,808,859 A | 2/1989 | Even-or et al. | |
| 5,003,246 A | 3/1991 | Nadd | 323/349 |
| 5,583,384 A | 12/1996 | Henry | |
| 6,509,781 B2 * | 1/2003 | Dufort | 327/434 |

FOREIGN PATENT DOCUMENTS

| | | |
|---|---|---|
| EP | 0 398 026 A2 | 11/1990 |
| EP | 1 091 490 A2 | 4/2001 |
| WO | WO 02/075924 A2 | 9/2002 |

* cited by examiner

Primary Examiner—Jeffrey Zweizig
(74) Attorney, Agent, or Firm—Dimock Stratton LLP; Mark B. Eisen

(57) ABSTRACT

A bi-directional solid state switch has two main transistors which are connected to each other with input to input and input referenced output to input referenced output. Each unreferenced transistor output is separately connected to an output terminal of the switch. An electrical impedance is connected between the input connection and the input referenced output connection. A driver signal is connected across the input connection and one output terminal. This circuit topology is counter-intuitive, but provides advantages which can include eliminating the need for electrical isolation, being capable of turning on or off at any time, at or between zero crossings, having a high speed of response, simplicity, reliability, cost-effectiveness, and energy-efficiency.

20 Claims, 3 Drawing Sheets

HIGH SPEED BI-DIRECTIONAL SOLID STATE SWITCH

FIELD OF THE INVENTION

This invention relates to bi-directional solid state switches, and more particularly to high-speed bi-directional solid state switches.

BACKGROUND OF THE INVENTION

In the prior art there are basically two types of bi-directional solid state switches which are commonly used. One is the triac, which is commonly used for switching AC (alternating current) power, and the other is the analog switch based on field effect transistors.

Triacs suffer from two major problems. The first is that once triggered, they remain in the on-state until the next zero crossing in the AC voltage. The other problem is that the device inherently has a voltage drop associated with it, which results in significant power dissipation.

Switches based on field effect transistors have been very successfully used for switching low-level analog signals, however, various technical difficulties have prevented their widespread acceptance for AC power switching applications.

Referring now to FIG. 1, it is demonstrated how a single NPN bipolar transistor together with a diode bridge can form a simple AC switch. The NPN bipolar transistor is only capable of switching on in one direction, however, the diode bridge changes the AC at the switch terminals into DC (direct current) going through the transistor.

It can be appreciated that such a switch can only work if the control signal to the transistor is in some way isolated from the AC power voltage. One method of doing this, which is well known in the prior art, illustrated in FIG. 2, is to use an isolation transformer. Isolation transformers do not work on DC voltages, however, if an AC voltage is provided to the transformer input, a diode bridge on the output of the transformer can convert it into a DC voltage signal suitable for driving the input of the bipolar transistor. Still, such a switch is far from ideal due to power dissipation in the diodes and the bipolar transistor. This is due to the inherent voltage drops in these devices. A bipolar transistor which is fully on, will have a voltage drop of at least 0.3 Volts, however this voltage drop can be as high as 1 V or even higher depending on the transistor. Diodes have an inherent voltage drop of approximately 0.7 V, and since the AC would have to flow through two diodes plus the transistor, a total voltage drop across the switch would be on the order of 2 Volts. This means that the power dissipation will be about 2 Watts for every Amp flowing through the switch.

Referring now to FIG. 3 it is shown how power dissipation can be greatly reduced through the use of field effect transistors, however, the problem of isolation between the AC voltage and the control signal remains. Since field effect transistors can conduct in both directions when they are in the on-state, there is no need for a diode bridge. However, field effect transistors will only block voltage in one direction when in the off-state. Therefore, if they are used in an AC switch (without a diode bridge), there must be two of them connected in series in opposite directions, either having a common source as shown in FIG. 3, or having a common drain as shown in FIG. 5. The prior art method of isolation presented in FIG. 3 suffers from a number of problems. One is the size, weight, and cost of the isolation transformer. Another is the complexity of the control circuit which must generate AC control signals to drive the isolation transformer. Finally, there is a loss of speed of response due to the frequency limitation of the transformer and the rectification circuit.

Referring now to FIG. 4, another approach to isolation is shown which is most commonly used in the prior art. In this instance the control signal drives a series of light emitting diodes in a photo-voltaic isolator. Photo-voltaic cells in the isolator receive the light energy from the light emitting diodes and convert it to control signals suitable for driving the field effect transistors. This approach eliminates the bulky expensive isolation transformer, and simplifies the circuit. The two major drawbacks of this approach are the cost of the photo-voltaic isolator, and its slow speed of response. Solid state relays based on this technology typically have response times in the millisecond range.

The idea of connecting two field effect transistors (FET) together in a common source configuration is known. Huth et al show just such a configuration in U.S. Pat. No. 3,532,899 issued Oct. 6, 1970, which is incorporated herein by reference, for the purpose of providing a solid state switch for switching analog signals. However, Huth et al do not give any details on how to drive the field effect transistor inputs while maintaining adequate separation between the control signal for the switch and the analog signals being switched.

McDonald in U.S. Pat. No. 4,611,123 issued Sep. 9, 1986, which is incorporated herein by reference, also proposes a solid state switch consisting of two field effect transistors in a common source arrangement, and proposes a method of driving the field effect transistor inputs. However, his field effect transistor signal input driver involves the use of optical isolation. Optical isolation is a valid technical solution, however it does have certain drawbacks. In particular, it makes the circuit more complicated, it adds to the cost, and it slows down the speed of the device.

Sorchych in U.S. Pat. No. 3,215,859 issued Nov. 2, 1965, which is incorporated herein by reference, proposes a method of controlling field effect transistors without the use of signal isolation. Power supply isolation is also not required by the method which he proposes. However, his circuit is only suitable for switching low level analog signals. Any AC voltage of 120 V would subject his bipolar transistors, used as drivers, to excessive emitter-base voltages which would damage the devices. This makes Sorchych's device unsuitable for use as a power switch in many typical applications.

Jaeschke in U.S. Pat. No. 4,480,201 issued Oct. 30, 1984, which is incorporated herein by reference, provides a more robust method of driving the main switch transistors, however he uses bipolar transistors instead of field effect transistors for the output stage, choosing rather to use field effect transistors to improve the performance of the bipolar transistors. The result is a circuit which is not particularly energy-efficient. Any AC power going through the switch must pass through one diode having a diode drop of 0.7 Volts and one power transistor having a voltage drop of at least 0.3 Volts resulting in an overall voltage drop of at least 1 V. This results in a power dissipation of at least one Watt per Amp.

Laughton in U.S. Pat. No. 4,591,734 issued May 27, 1986, which is incorporated herein by reference, demonstrates the use of insulated gate bipolar transistors (IGBT) for the output of his AC switch. In addition to the problem of high power dissipation resulting from the voltage drop across the insulated gate bipolar transistors and diodes in the circuit, this circuit has limited use because Laughton grounds the emitters of the insulated gate bipolar transistors. This eliminates the need to isolate the signal input, however, this circuit can only be used where the AC voltage is isolated. In most cases this would require an expensive power isolation transformer, which would of course be more costly than a signal isolation transformer.

Chang et al in U.S. Pat. No. 4,742,380 issued May 3, 1988, which is incorporated herein by reference, show an AC switch which makes use of bipolar transistors, field effect transistors and thyristors. For this circuit to work properly, the emitter of the PNP transistor would need to be higher than the AC voltage. The result of this is the need for a high voltage DC power supply. Furthermore, this would not be a particularly energy efficient switch due to resistors in series with the field effect transistors, and the voltage drops across the thyristors. In addition to these drawbacks the control would be limited, because once triggered, the thyristors would remain on until the next zero crossing in the AC voltage.

Janutka in U.S. Pat. No. 4,477,742 issued Oct. 16, 1984, which is incorporated herein by reference, shows an AC switch with a common drain configuration. In this circuit the gates of the two field effect transistors are tied together. The result of this is that the voltage capability of the switch is limited by the gate-source breakdown voltages of the field effect transistors which is typically 20 Volts. This makes the circuit unsuitable for typical power applications which require substantially higher voltages.

Nadd in U.S. Pat. No. 5,003,246 issued Mar. 26, 1991, which is incorporated herein by reference, also provides a common drain configuration. There are at least four problems with this circuit. Firstly, it has field effect transistors with common gates and output terminals connected across the full AC voltage. The result of this is that the voltage capability of the switch is limited by the gate-source voltage capability of these field effect transistors. Another problem is that the switch does not respond immediately to activating control signals, but rather waits for the next zero crossing before turning on. The third problem has to do with energy efficiency. To be energy-efficient, the control resistor R1 must have a high resistance value because it is loaded with almost the entire AC voltage. However, a consequence of this resistor having a high value is that the speed of response of the switch is slowed down considerably due to the gate capacitance of the field effect transistor TP2. One could, of course, speed up the switch by lowering the resistance of the resistor R1, but that would result in increased power dissipation in the resistor due to the high-voltage AC. Finally, it should be noted that the switch never really turns fully off because of current flowing through the control resistor R1 when the switch is in the off-state.

BRIEF SUMMARY OF THE INVENTION

The invention overcomes these disadvantages by providing a high speed bi-directional solid state switch wherein the control input and load output share a common terminal, which may be grounded, and which operates without any requirement for isolation. The switch can be turned on or off at any time, at or between zero crossings. The bi-directional solid state power switch of the invention is simple, reliable, cost-effective, energy-efficient, and possesses a high speed of response.

According to a preferred embodiment of the invention, two field effect transistors are connected with gate connected to gate and source connected to source. Each drain is separately connected to a switch output terminal. A resistor is connected between the gate connection and the source connection. The driver signal is connected across the gate connection and one of the drain terminals. This circuit topology provides aforementioned advantages, and does not need electrical isolation.

The present invention thus provides a bi-directional solid state switch comprising at least two main transistors, each comprising a control terminal, a second terminal referenced to the control terminal, and a third terminal for conducting an electric current between the second and third terminals; the control terminals of the two main transistors being electrically connected and the second terminals of the two main transistors being electrically connected, the control terminals being electrically connected to the second terminals through at least one device having an impedance, a first switch control input for connection to the control terminals of the two main transistors, for selectively applying an activating control signal from one side of an electric signal source, and a second switch control input for connecting the third terminal of one of the main transistors to the other side of the electric signal source, wherein when the activating control signal is applied to the switch control inputs, an electric current can be conducted through the main transistors.

DETAILED DESCRIPTION OF THE INVENTION

Figure 1:
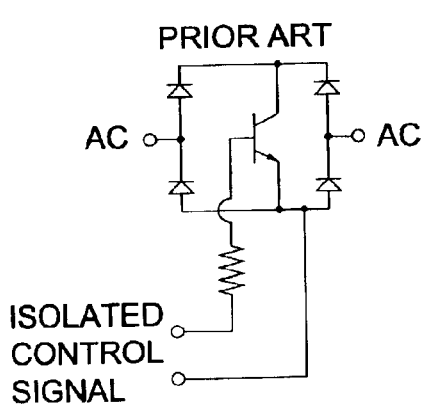
FIG. 1. is a schematic circuit diagram showing an AC solid state switch which comprises a diode bridge and a bipolar transistor.
Figure 2:
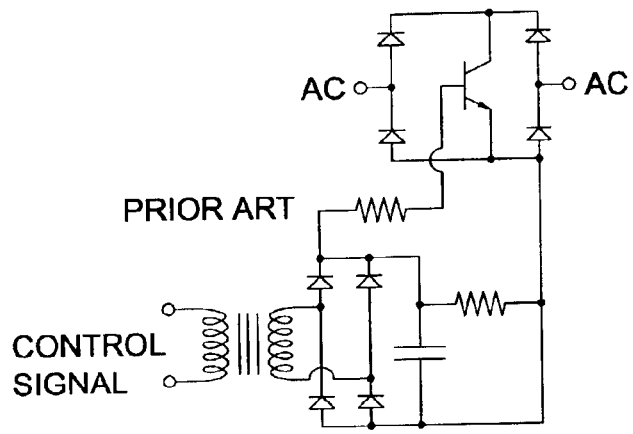
FIG. 2. is a schematic circuit diagram showing an AC solid state switch which comprises a diode bridge and a bipolar transistor, wherein an isolating transformer is used to provide the required isolation between input and output.
Figure 3:
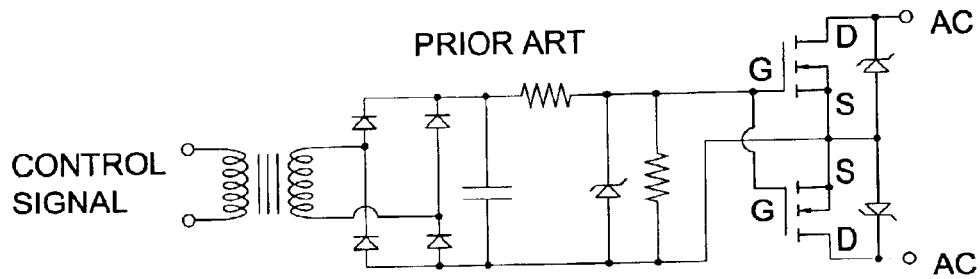
FIG. 3. is a schematic circuit diagram showing an AC solid state switch comprising field effect transistors, where an isolating transformer is used to provide the required isolation between input and output.
Figure 4:
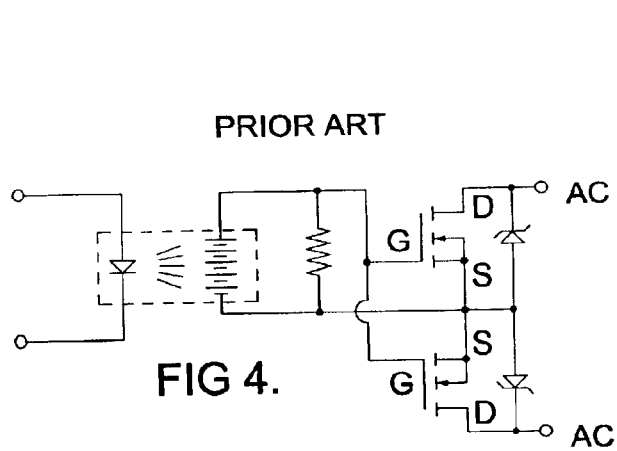
FIG. 4. is a schematic circuit diagram showing an AC solid state switch comprising two field effect transistors, wherein a photo-voltaic isolator is used to drive the transistors and provide the required isolation between input and output.
Figure 5:
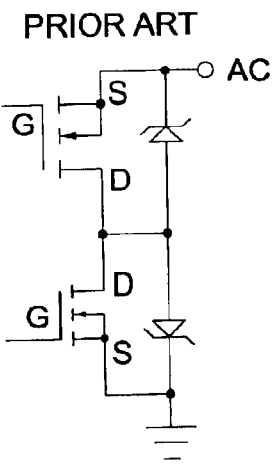
FIG. 5. is a schematic circuit diagram showing an AC solid state switch comprising two field effect transistors wherein the transistors have their drains connected together.

Referring now to the prior art bi-directional switching device shown in FIG. 5, in this solid state switching circuit where one output terminal of the switch is connected to ground or connected in common with the ground reference of the control signal, it is intuitive that the source of a field effect transistor (FET) be connected to ground or common. This is because it is the voltage between the gate and the source that determines whether the field effect transistor is on or off. In other words, the source is the terminal which is referenced to the control terminal (or gate), while the drain is the unreferenced terminal and allows current to flow between it and the referenced terminal in both directions when the device is in the on-state. If the circuit is required to be bi-directional or required to switch AC, then a second field effect transistor is required to be connected in series and in the opposing direction as shown. This is because a field effect transistor can block voltage in one direction only. Consequently, the intuitive approach leads to a common drain circuit topology for a field effect transistor switching circuit if that circuit is required to switch AC and if one of the switch output terminals is connected in common with the reference terminal of the control signal.

Figure 6:
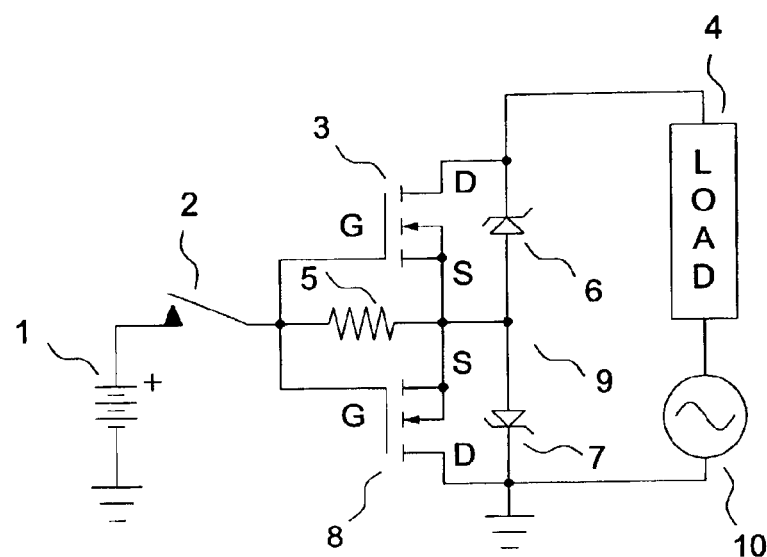
FIG. 6. is a schematic circuit diagram showing an AC solid state switch in accordance with the present invention.

A preferred embodiment of the invention is illustrated in FIG. 6, in which the drain D of field effect transistor 8 is connected to the ground terminal. Switch 2, which is controllable, acts in combination with battery 1 as an electric signal source. One side of battery 1, which acts as a source of electricity, is connected to a terminal of switch 2, the other terminal of which in turn is connected to both gates G and, through resistor 5, to both sources S. The drain of field effect transistor 3 is connected to one side of the load 4, the other side of the load 4 being connected to one terminal of the AC power supply 10. The other terminal of the AC power supply 10 is connected to drain D of field effect transistor 8, which is also connected to the other side of battery 1. In this instance, the connection point of the gates G acts as a first switch control input, while the drain D of field effect transistor 8 acts as a second switch control input (in the embodiment shown, both drain D of field effect transistor 8 and the negative side of battery 1 are grounded, but as will be explained below this is unnecessary as long as they are electrically connected). Connecting the drain D of field effect transistor 8 to the ground or common terminal is counterintuitive, however, this approach provides significant advantages.

In operation, if switch 2 is open, then resistor 5 causes the gate-to-source voltage of the two main field effect transistors 3 and 8 to be zero, causing both transistors 3 and 8 to be turned off. In this state the two transistors will block the AC voltage coming from AC voltage source 10, and through AC load 4, in both directions. Although zener diodes 6 and 7 are shown as circuit elements, it will be understood that typically each of these diodes 6, 7 is inherent to or integrated into its respective field effect transistor 3 and 8, but zener diodes 6 and 7 could alternatively be separate circuit components. It will be appreciated that resistor 5 could be replaced by a different component having an impedance, such as an inductor, or a semiconductor device which may or may not itself be controllable, or even by a combination of devices which have an impedance. Such alternatives may enhance performance under certain conditions such as high frequency operation, and may contribute to increased efficiency. Such a device which has an impedance could also be made to be inherent to or integrated into at least one transistor. It will also be appreciated that although field effect transistors 3 and 8 are preferably identical, they do not need to be identical for the advantages of the invention to be achieved, and that the other side of battery 1 could be connected to the drain D of either field effect transistor 3 or 8.

If switch 2 is closed, then the voltage from battery 1 is applied between the gate G and drain D of field effect transistor 8 (to the gate G through switch 2 and to the drain D through the ground terminal). Depending on the instantaneous polarity of the AC power, either diode 6 or diode 7 will then enable current to flow through resistor 5. The result of this is that a voltage will appear across the gates G and sources S of both transistors 3 and 8. Both transistors 3 and 8 will then be turned on and conduct in both directions. Because of diode 7, the common source connection 9 will not have a voltage higher than approximately 0.7 Volts (which is less than the voltage from battery 1), and therefore switch 2 only needs to block voltage in one direction. As a result, switch 2 can be replaced by any transistor, including a field effect transistor, a bipolar transistor, an IGBT (insulated gate bipolar transistor), or any functional equivalent.

Figure 7:
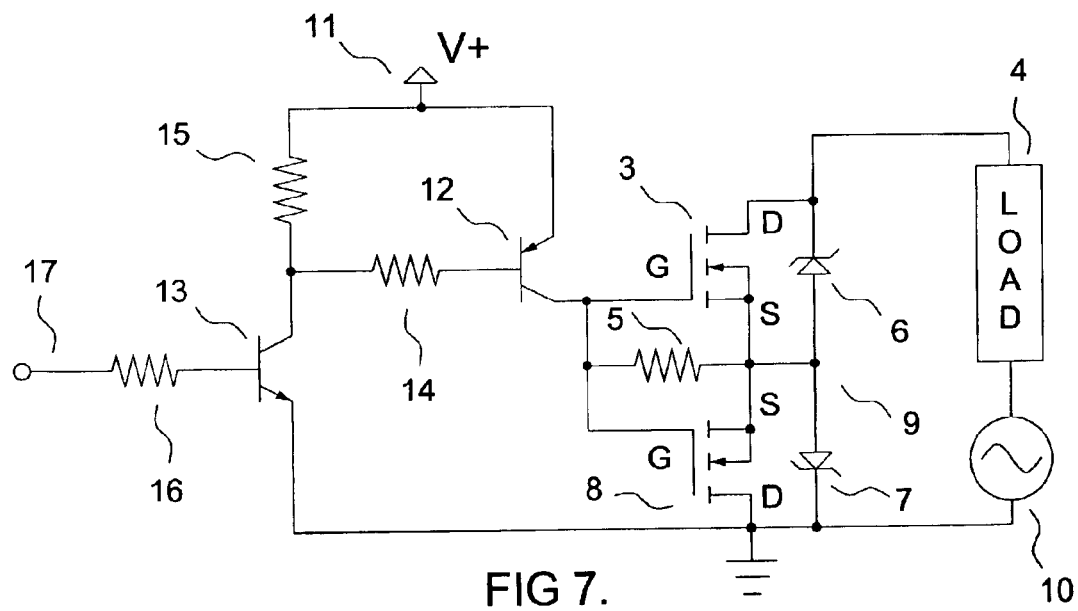
FIG. 7. is a schematic diagram showing an AC solid state switch in accordance with a preferred embodiment of the present invention, wherein the driver circuit comprises bipolar transistors.

Referring now to FIG. 7, in this embodiment of the invention the control signal is provided to the field effect transistors 3, 8 by a driver circuit comprising bipolar PNP transistor 12. Bipolar PNP transistor 12 is turned on by bipolar NPN transistor 13, whenever a sufficiently positive activating control signal is applied to input terminal 17. Resistor 16 serves to limit the base current of bipolar NPN transistor 13, while resistor 14 serves to limit the base current of bipolar PNP transistor 12. Resistor 15 maintains PNP transistor 12 in an off-state in the absence of an activating control signal at terminal 17, by removing any leakage current which may exist. The DC voltage source 11 provides the low gate voltage required by the field effect transistors 3 and 8. If the field effect transistors 3 and 8 are logic level field effect transistors, then this voltage can be as low as 5 or 6 Volts.

Figure 8:
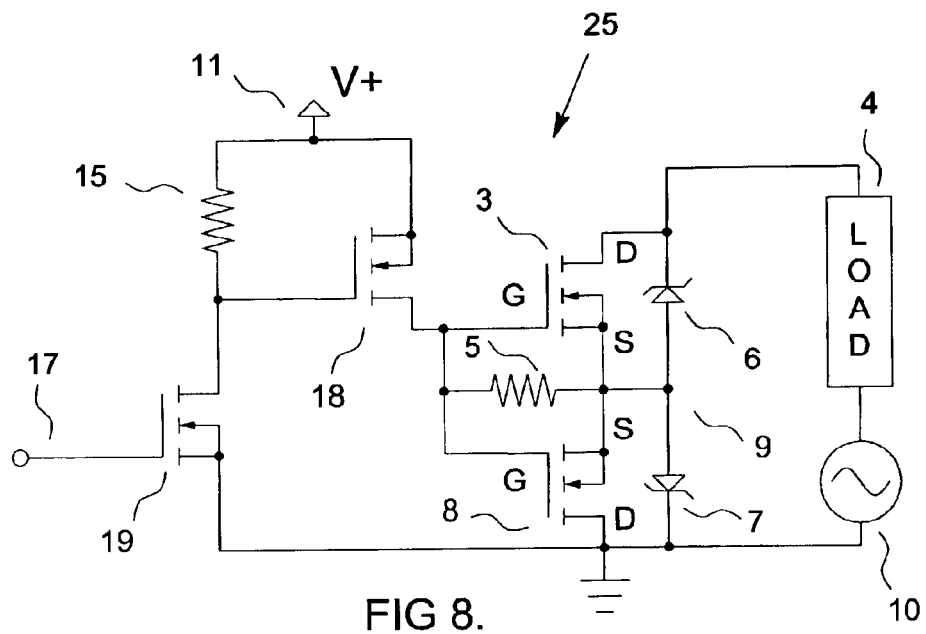
FIG. 8. is a schematic diagram showing an AC solid state switch in accordance with an alternative preferred embodiment of the present invention, wherein the driver circuit comprises field effect transistors.

FIG. 8 illustrates an alternate preferred embodiment of the present invention, in which the driver circuit comprises field effect transistors 18 and 19 performing the function of bipolar transistors 12 and 13 of FIG. 7. In this instance, resistor 15 provides the additional function of returning the switch to the off-state after the activating control signal is removed. If the circuit is constructed using discrete components, it may be more cost-effective to use bipolar transistors for the driver circuit as in FIG. 7. If, however, the circuit is constructed as a monolithic device, it may be better for the driver to use field effect transistors as in FIG. 8.

It should be noted that while the circuits of FIGS. 7 and 8 are both shown to be grounded, grounding is in fact unnecessary provided that both the control signal applied to input terminal 17 and the FET driver voltage source 11 are referenced to the same drain terminal D. However, AC power circuits typically are grounded, which is one of the advantages of the present invention, because grounding the AC supply circuit does not pose a problem for the present invention, while it does pose a problem for some of the aforementioned prior art. While the ability to operate without the need for isolation may be advantageous in certain applications, the present invention has other advantages, as referred to previously, which may make it advantageous to use the present invention in applications where isolation is required anyway for other reasons.

Figure 9:
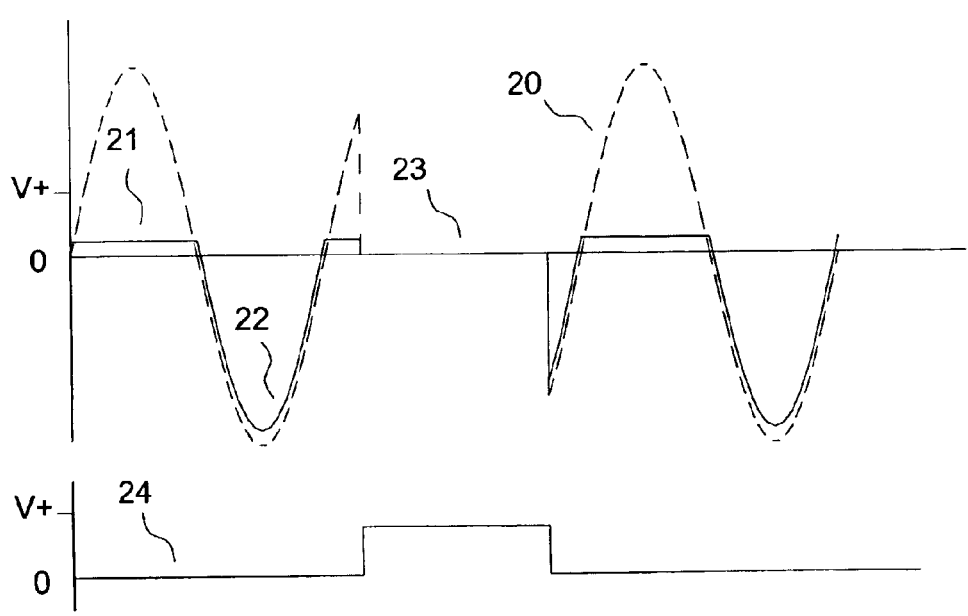
FIG. 9. is a graph showing electrical waveforms of the present invention.

As shown in FIG. 9, waveform 20, which is shown by a dashed line, represents the voltage which appears on the drain terminal D of the field effect transistor 3 in FIG. 8 and is sinusoidal when switch 25 is turned off. The voltage 21, 22 at the common source connection 9 in FIG. 8 is shown by a solid line in the upper graph of FIG. 9. During the positive portion of the AC waveform 20, the voltage 21 at the common source connection 9 is slightly above ground potential due to diode 7. For this reason, FET driver voltage source 11 only needs to be slightly higher than the on-state gate-to-source voltage requirement for field effect transistors 3 and 8. During the negative portion of the AC waveform 20, the voltage 22 at the common source connection 9 is only slightly above the AC waveform voltage. As a consequence, driver circuit transistor 18 must have a high voltage capability (as must driver circuit transistor 12 in FIG. 7) if the switch 25 is used to switch high voltage AC. When the switch control signal 24 applied to terminal 17, shown by a solid line in the lower graph of FIG. 9, exceeds the gate threshold voltage for driver circuit transistor 19, both voltages 20 and 21, 22 become almost zero. In this state, the switch 25 is turned fully on and the AC load 4 has full power. The switch 25 can be turned on or off at any time and without any need to wait for zero crossings in the AC waveform 20.

Because there is no isolation to slow the switch 25 down, it has a very high speed of response, in fact it may be orders of magnitude faster than a typical optically-isolated solid state relay. The circuit of the invention is very simple and reliable and very cost-effective, with most of the cost being in the field effect transistors. It also has the potential for being much more energy efficient than bipolar transistors, triacs and thyristors. Applications for this technology include but are not limited to light dimmers, motor controls, switch-mode power supplies, interface output modules, signal generation, and remote and automatic controls.

Preferred embodiments of the invention having been thus described by way of example only, it will be appreciated that various modifications and adaptations may be made without departing from the scope of the invention as set out in the appended claims.

I claim:

1. A bi-directional solid slate switch comprising:
    at least two main transistors, each comprising
        a control terminal,
        a second terminal referenced to the control terminal, and
        a third terminal for conducting an electric current between the second and third terminals;
    the control terminals of the two main transistors being electrically connected and the second terminals of the two main transistors being electrically connected, the control terminals being electrically connected to the second terminals through at least one device having an impedance,
    a first switch control input for connection to the control terminals of the two main transistors, for selectively applying an activating control signal voltage from one side of an electric signal voltage source, and a second switch control input for connecting the third terminal of one of the main transistors to the other side of the electric signal voltage source,
wherein when the activating control signal voltage is applied to the switch control inputs, an electric current can be conducted through the main transistors, and such that a rate of change of the voltage on the first switch control input depends, at least in part, on a magnitude of any negative voltage on the other third terminal with respect to the connection between the second switch control input and its thereto connected third terminal.

2. A bi-directional solid state switch according to claim 1, wherein at least one main transistor is a field effect transistor, wherein at least one control terminal is a gate, and wherein at least one second terminal is a source, and wherein at least one third terminal is a drain.

3. A bi-directional solid state switch according to claim 1, wherein at least one electrical device having an impedance, is a resistor.

4. A bi-directional solid state switch according to claim 1, wherein at least one electrical device having an impedance, is a semiconductor device.

5. A bi-directional solid state switch according to claim 4, wherein the semiconductor device, is a controllable semiconductor device.

6. A bi-directional solid state switch according to claim 1 wherein at least one electrical device having an impedance is inherent to or integrated into at least one main transistor.

7. A bi-directional solid stake switch according to claim 2 wherein at least one electrical device having an impedance is inherent to or integrated into at least one main transistor.

8. A bi-directional solid state switch according to claim 3 wherein at least one electrical device having an impedance is inherent to or integrated into at least one main transistor.

9. A bi-directional solid state switch according to claim 4 wherein at least one electrical device having an impedance is inherent to or integrated into at least one main transistor.

10. A bi-directional solid state switch according to claim 5 wherein at least one electrical device having an impedance is inherent to or integrated into at least one main transistor.

11. A bi-directional solid state switch according to claim 1 wherein the electric signal voltage source comprises a switching device having a terminal connected to one side of a source of electric voltage, and another terminal connected to said first switch control input, the other side of the source of electric voltage being connected to said second switch control input.

12. A bi-directional solid state switch according to claim 2 wherein the electric signal voltage source comprises a switching device having a terminal connected to one side of a source of electric voltage, and another terminal connected to said first switch control input, the other side of the source of electric voltage being connected to said second switch control input.

13. A bi-directional solid state switch according to claim 3 wherein the electric signal voltage source comprises a switching device having a terminal connected to one side of a source of electric voltage, and another terminal connected to said first switch control input, the other side of the source of electric voltage being connected to said second switch control input.

14. A bi-directional solid state switch according to claim 4 wherein the electric signal voltage source comprises a switching device having a terminal connected to one side of a source of electric voltage, and another terminal connected to said first switch control input, the other side of the source of electric voltage being connected to said second switch control input.

15. A bi-directional solid state switch according to claim 5 wherein the electric signal voltage source comprises a switching device having a terminal connected to one side of a source of electric voltage, and another terminal connected to said first switch control input, the other side of the source of electric voltage being connected to said second switch control input.

16. A bi-directional solid state switch according to claim 11, wherein the switching device comprises a transistor.

17. A bi-directional solid state switch according to claim 12, wherein the switching device comprises a transistor.

18. A bi-directional solid state switch according to claim 11, wherein the source of electricity comprises a DC power supply.

19. A bi-directional solid state switch according to claim 12, wherein the source of electricity comprises a DC power supply.

20. A bi-directional solid state switch according to claim 1, wherein at least one main transistor is a field effect transistor, and wherein at least one electrical device having an impedance is a resistor, and wherein tho electric signal voltage source comprises a transistor having a terminal connected to one side of a DC power supply and another terminal connected to said first switch control input, the other terminal of said DC power supply being connected to the third terminal of one of the main power transistors.

* * * * *